(12) United States Patent
Xiong et al.

(10) Patent No.: US 8,497,151 B2
(45) Date of Patent: Jul. 30, 2013

(54) PHOTOVOLTAIC DEVICE

(75) Inventors: Gang Xiong, Perrysburg, OH (US);
Ricky C. Powell, Ann Arbor, MI (US);
Aaron Roggelin, Millbury, OH (US);
Kuntal Kumar, Sylvania, OH (US);
Arnold Allenic, Ann Arbor, MI (US);
Kenneth M. Ring, Waterville, OH (US);
Charles Wickersham, Columbus, OH (US)

(73) Assignee: First Solar, Inc., Perrysburg, OH (US)

( * ) Notice: Subject to any disclaimer, the term of this patent is extended or adjusted under 35 U.S.C. 154(b) by 536 days.

(21) Appl. No.: 12/709,858

(22) Filed: Feb. 22, 2010

(65) Prior Publication Data

US 2010/0288359 A1    Nov. 18, 2010

Related U.S. Application Data

(60) Provisional application No. 61/177,502, filed on May 12, 2009.

(51) Int. Cl.
*H01L 21/00* (2006.01)

(52) U.S. Cl.
USPC .................................. 438/57; 257/E25.009

(58) Field of Classification Search
USPC ........ 438/69, 84, 87, 94, 95, 98, 57; 136/252, 136/262, 265
See application file for complete search history.

(56) References Cited

U.S. PATENT DOCUMENTS

| | | | |
|---|---|---|---|
| 5,217,539 A | 6/1993 | Fraas et al. | |
| 7,838,763 B2 * | 11/2010 | Hollars | 136/265 |
| 2005/0009228 A1 | 1/2005 | Wu et al. | |
| 2007/0111367 A1 | 5/2007 | Basol | |
| 2009/0014055 A1 | 1/2009 | Beck et al. | |
| 2009/0078318 A1 * | 3/2009 | Meyers et al. | 136/260 |

* cited by examiner

*Primary Examiner* — Brook Kebede
(74) *Attorney, Agent, or Firm* — Dickstein Shapiro LLP

(57) ABSTRACT

A method to improve CdTe-based photovoltaic device efficiency is disclosed. The CdTe-based photovoltaic device can include oxygen or silicon in semiconductor layers.

16 Claims, 1 Drawing Sheet

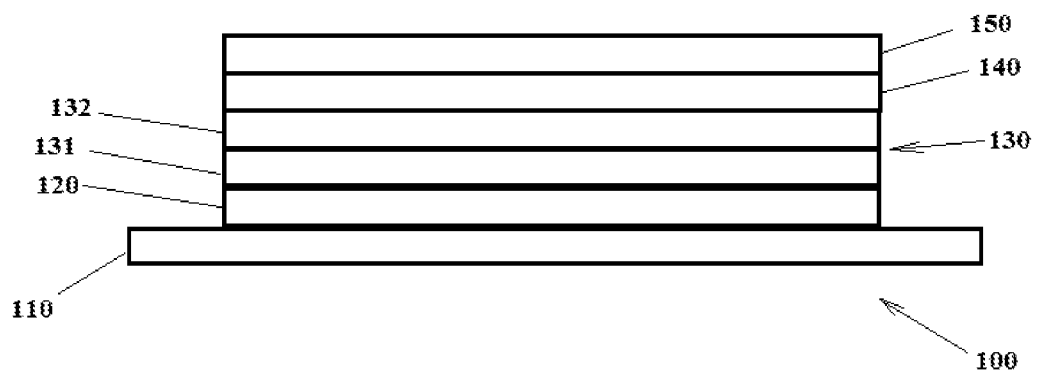

PHOTOVOLTAIC DEVICE

CLAIM OF PRIORITY

This application claims priority to U.S. Provisional Patent Application No. 61/177,502, filed on May 12, 2009, which is incorporated by reference in its entirety.

TECHNICAL FIELD

This invention relates to a photovoltaic device with improved efficiency.

BACKGROUND

During the fabrication of photovoltaic devices, layers of semiconductor material can be applied to a substrate with one layer serving as a window layer and a second layer serving as the absorber layer. The window layer can allow the penetration of solar radiation to the absorber layer, where the optical power is converted into electrical power. Some photovoltaic devices can use transparent thin films that are also conductors of electrical charge. The conductive thin films can include transparent conductive layers that contain a transparent conductive oxide (TCO), such as fluorine-doped tin oxide, aluminum-doped zinc oxide, or indium tin oxide. The TCO can allow light to pass through a semiconductor window layer to the active light absorbing material and also serve as an ohmic contact to transport photogenerated charge carriers away from the light absorbing material. A photovoltaic device can have a Cadmium Sulfide (CdS) layer as a semiconductor window layer and a Cadmium Telluride (CdTe) layer as a semiconductor absorber layer. A back electrode can be formed on the back surface of a semiconductor layer. The back electrode can include electrically conductive material, such as metallic silver, nickel, copper, aluminum, titanium, palladium, chrome, molybdenum or any practical combination thereof.

DESCRIPTION OF DRAWINGS

FIG. 1 is a schematic of a photovoltaic device having multiple semiconductor layers and a metal back contact.

DETAILED DESCRIPTION

A photovoltaic device can include a transparent conductive oxide layer adjacent to a substrate and layers of semiconductor material. The layers of semiconductor material can include a bi-layer, which may include an n-type semiconductor window layer, and a p-type semiconductor absorber layer. The n-type window layer and the p-type absorber layer may be positioned in contact with one another to create an electric field. Photons can free electron-hole pairs upon making contact with the n-type window layer, sending electrons to the n side and holes to the p side. Electrons can flow back to the p side via an external current path. The resulting electron flow provides current which, combined with the resulting voltage from the electric field, creates power. The result is the conversion of photon energy into electric power.

Techniques are developed to extend pn-junction depletion width in CdTe-based photovoltaic device devices. With this approach, high efficiency photovoltaic devices can be achieved through improved collection efficiency and thus higher $J_{sc}$. Methods to extend pn-junction depletion width in CdTe include but not limited to modifying film properties in the p- and/or n-type layer. For example it can be achieved by adding certain type of materials to CdTe and/or n-type window layer. The additive materials can include such as but not limited to silicon-containing materials. Such additions can be introduced through raw material treatment, during coating process or post-deposition treatment. It is also found that some of these materials may behave as flux agent modifying CdTe crystalline growth. Modification in sub band-gap optical properties is also observed.

In one aspect, a method of manufacturing a photovoltaic device can include the steps of depositing a transparent conductive oxide layer adjacent to a substrate, depositing a semiconductor window layer adjacent to the transparent conductive oxide layer, depositing a semiconductor absorber layer adjacent to the semiconductor window layer, and depositing a back contact layer adjacent to the semiconductor absorber layer. One or more of the semiconductor window layer and the semiconductor absorber layer can include a carrier concentration modifier. One or more of the semiconductor window layer and the semiconductor absorber layer can include a II-VI semiconductor. The semiconductor window layer can include cadmium sulfide (CdS). The semiconductor absorber layer can include cadmium telluride (CdTe). The carrier concentration modifier can include oxygen. The carrier concentration modifier can include silicon. The method can further include increasing carrier concentration in the semiconductor window layer.

The method can further include decreasing carrier concentration in the semiconductor absorber layer. The method can further include adding material comprising silicon to the semiconductor absorber layer. The method can further include adding material comprising oxygen to the semiconductor absorber layer. The method can further include adding material comprising oxygen to the semiconductor window layer. The method can further include adding material comprising oxygen to the semiconductor absorber layer and semiconductor window layer. The step of depositing of the semiconductor absorber layer can include vapor transport deposition (VTD) from a cadmium and telluride source.

The vapor transport deposition (VTD) can include blending material comprising oxygen with the cadmium and telluride source. The vapor transport deposition (VTD) can include blending material comprising silicon with the cadmium and telluride source. The step of depositing of the semiconductor absorber layer can include using precursor comprising oxygen. The step of depositing of the semiconductor absorber layer can include using precursor comprising silicon. The method can further include a step of post-deposition treatment on the semiconductor absorber layer and semiconductor window layer in an environment including oxygen. The method can further include a step of post-deposition treatment on the semiconductor absorber layer and semiconductor window layer in an environment including silicon. The method can further include a step of depositing of an additional layer including oxygen, wherein the oxygen of the additional layer can diffuse into the semiconductor absorber layer and semiconductor window layer. The method can further include a step of depositing of an additional layer comprising silicon, wherein the silicon of the additional layer can diffuse into the semiconductor absorber layer and semiconductor window layer.

The transparent conductive oxide layer can include oxygen, wherein the oxygen of the transparent conductive oxide layer can diffuse into the semiconductor absorber layer and semiconductor window layer. The transparent conductive oxide layer can include silicon, wherein the silicon of the transparent conductive oxide layer can diffuse into the semiconductor absorber layer and semiconductor window layer.

The back contact layer can include oxygen, wherein the oxygen of the back contact layer can diffuse into the semiconductor absorber layer and semiconductor window layer. The back contact layer can include silicon, wherein the silicon of the back contact layer can diffuse into the semiconductor absorber layer and semiconductor window layer.

The method can further include adding material comprising a group IV element to the semiconductor absorber layer. The method can further include adding material including a group IV element to the semiconductor window layer. The method can further include adding material including a group IV element to the semiconductor absorber layer and semiconductor window layer. The method can further include adding material comprising a group VI element to the semiconductor absorber layer. The method can further include adding material comprising a group VI element to the semiconductor window layer. The method can further include adding material comprising a group VI element to the semiconductor absorber layer and semiconductor window layer.

In one aspect, a CdTe-based photovoltaic device can include a transparent conductive oxide layer, a semiconductor bi-layer adjacent to the transparent conductive oxide layer, and a back contact layer adjacent to the semiconductor bi-layer. The semiconductor bi-layer can include a semiconductor absorber layer and a semiconductor window layer and one or more of the semiconductor window layer and the semiconductor absorber layer can include a carrier concentration modifier. The semiconductor window layer can include increased carrier concentration. The semiconductor absorber layer can include decreased carrier concentration. The semiconductor absorber layer can include material including silicon. The semiconductor absorber layer can include material including oxygen. The semiconductor window layer can include material including oxygen. The semiconductor window layer and semiconductor absorber layer can include material including oxygen.

Referring to FIG. 1, a photovoltaic device 100 can include a transparent conductive oxide layer 120 deposited adjacent to a substrate 110. Transparent conductive oxide layer 120 can be deposited on substrate 110 by sputtering or evaporation. Substrate 110 can include a glass, such as soda-lime glass. Transparent conductive oxide layer 120 can include any suitable transparent conductive oxide material, including a cadmium stannate, an indium-doped cadmium oxide, or a tin-doped indium oxide. A semiconductor bi-layer 130 can be formed or deposited adjacent to annealed transparent conductive oxide layer 120. Semiconductor bi-layer 130 can include semiconductor window layer 131 and semiconductor absorber layer 132. Semiconductor window layer 131 of semiconductor bi-layer 130 can be deposited adjacent to annealed transparent conductive oxide layer 120. Semiconductor window layer 131 can include any suitable window material, such as cadmium sulfide, and can be formed by any suitable deposition method, such as sputtering or vapor transport deposition. Semiconductor absorber layer 132 can be deposited adjacent to semiconductor window layer 131. Semiconductor absorber layer 132 can be deposited on semiconductor window layer 131. Semiconductor absorber layer 132 can be any suitable absorber material, such as cadmium telluride, and can be formed by any suitable method, such as sputtering or vapor transport deposition. Back contact 140 can be deposited adjacent to semiconductor absorber layer 132. Back contact 140 can be deposited adjacent to semiconductor bi-layer 130. A back support 150 can be positioned adjacent to back contact 140. A photovoltaic device can have a Cadmium Sulfide (CdS) layer as a semiconductor window layer and a Cadmium Telluride (CdTe) layer as a semiconductor absorber layer.

In CdTe-based photovoltaic device devices, the depletion region occurs mostly within the CdTe because it is typically less doped as compared to the n-type layer. The extension of the depletion width increases the depth from which photo-generated carrier can be efficiently collected, which improves photocurrent and solar efficiency. As the results, one will expect to see higher total current, overall higher quantum efficiency throughout the solar spectrum. There are multiple approaches led to extended depletion width. For example, the depletion width typically increases when free carrier concentration in CdTe decreases. This can be achieved by reducing the concentration of doping levels in the CdTe layer or by introducing compensating levels within the energy gap of the semiconductor. While introducing compensating levels could potentially lower device open circuit voltage and fill factor through additional recombination through these levels, we have found in some cases that the improvement in close-circuit current density ($J_{sc}$) dominates, thus to result in higher efficiency devices. Close-circuit current density ($J_{sc}$) is the photocurrent output from a photovoltaic device when the output terminals are short-circuited. For example, adding silicon is found to be very effective to induce such efficiency improvement. The earlier approach of silicon addition utilized elements from vapor transport deposition (VTD) tools. These elements including silicon, which can be released thermally or when reacting with other reactants including $O_2$, $H_2$, $H_2O$ and even ambient air. The released silicon was included in the as-deposited film and can be detected by compositional analysis techniques such as secondary-ion mass spectroscopy (SIMS) or ICP-MS. Note this approach can be easily implemented at other deposition tools in addition to VTD.

In one example, Si can be released from VTD elements and result in higher efficiency through improved $J_{sc}$. When Si was forced to release from one coater, the efficiency can be improved and was driven by $J_{sc}$. Compared to IV parameters from control samples running simultaneously on another VTD tool but without forced Si release, $J_{sc}$ and efficiency of the samples with forced Si release can be about 4% higher. Si-doping concentration can be in the range from $1 \times 10^{16}$ to $1 \times 10^{18}/cm^3$.

The addition of oxygen during VTD process can also yield high $J_{sc}$ devices. A typical approach of doing so is introducing oxygen-containing source during deposition. By delivering oxygen into VTD chamber during film growth, an improvement on $J_{sc}$ can be achieved. The secondary-ion mass spectroscopy (SIMS) can reveal the actual oxygen incorporation in CdTe.

Direct addition of materials including silicon during VTD process is also very effective in producing high $J_{sc}$ devices. In one example, this is realized through mixing silicon-containing powders with CdTe powders to a certain blend ratio. Incorporation of Si in material can be measured by secondary-ion mass spectroscopy (SIMS). High $J_{sc}$ devices can be achieved by this method, and under certain doping conditions, higher efficiency devices can be realized (such as 850 ppm). The blend percentage of Si can be in the range from 0.001% to 1%, or 0.01% to 0.2%. $J_c$ and efficiency of the samples with the incorporation of Si can be about 1%, 2%, 3%, 4%, or 5% higher. In one example, silicon can modify the growth of CdTe and the crystalline structures. With the inclusion of silicon, grain size of CdTe becomes significantly smaller, while the crystalline orientation changes from (001), without Si addition, to (011) with modest Si addition, and to (012) with heavy Si addition. The improvements in optical transmission, reflectance and absorbance with silicon-inclusion can also be found. In general it is found that within the energy band gap, the transmission and reflection will decrease, and absorbance will increase with the increase of silicon concentration in the film. The inclusion of Si-containing material can lead to a measureable change in sub-band gap absorption (800-1400 nm).

A number of embodiments of the invention have been described. Nevertheless, it will be understood that various modifications may be made without departing from the spirit and scope of the invention. It should also be understood that the appended drawings are not necessarily to scale, presenting a somewhat simplified representation of various preferred features illustrative of the basic principles of the invention.

What is claimed is:

1. A method of manufacturing a photovoltaic device comprising the steps of:
    depositing a transparent conductive oxide layer over a substrate;
    depositing a semiconductor window layer over the transparent conductive oxide layer;
    depositing a semiconductor absorber layer over the semiconductor window layer, wherein one or more of the semiconductor window layer and the semiconductor absorber layer comprises a carrier concentration modifier, wherein the carrier concentration modifier comprises silicon; and
    depositing a back contact layer over the semiconductor absorber layer.

2. The method of claim 1, wherein one or more of the semiconductor window layer and the semiconductor absorber layer comprises a II-VI semiconductor.

3. The method of claim 1, wherein the semiconductor window layer comprises cadmium sulfide (CdS).

4. The method of claim 1, wherein the semiconductor absorber layer comprises cadmium telluride (CdTe).

5. The method of claim 1, further comprising increasing carrier concentration in the semiconductor window layer.

6. The method of claim 1, further comprising adding material comprising silicon to the semiconductor window layer or the semiconductor absorber layer.

7. The method of claim 1, wherein the step of depositing of the semiconductor absorber layer comprises vapor transport deposition (VTD) from a cadmium and telluride source.

8. The method of claim 7, wherein the vapor transport deposition (VTD) comprises blending material comprising silicon with the cadmium and telluride source.

9. The method of claim 8, wherein a blend percentage of silicon in the cadmium and telluride source is in the range of 0.01% to 0.02%.

10. The method of claim 8, wherein a blend percentage of silicon in the cadmium and telluride source is in the range of 0.001% to 1%.

11. The method of claim 1, wherein the step of depositing of the semiconductor absorber layer comprises using a precursor comprising silicon.

12. The method of claim 1, further comprising a step of post-deposition treatment of the semiconductor absorber layer and semiconductor window layer in an environment comprising silicon.

13. The method of claim 1, further comprising a step of depositing of an additional layer comprising silicon, wherein the silicon of the additional layer can diffuse into the semiconductor absorber layer and semiconductor window layer.

14. The method of claim 1, wherein the transparent conductive oxide layer comprises silicon, wherein the silicon of the transparent conductive oxide layer can diffuse into the semiconductor absorber layer and semiconductor window layer.

15. The method of claim 1, wherein the back contact layer comprises silicon, wherein the silicon of the back contact layer can diffuse into the semiconductor absorber layer and semiconductor window layer.

16. The method of claim 1, further comprising decreasing carrier concentration in the semiconductor absorber layer.

* * * * *